US008334538B2

(12) United States Patent
Lee et al.

(10) Patent No.: US 8,334,538 B2
(45) Date of Patent: Dec. 18, 2012

(54) THIN FILM TRANSISTOR ARRAY PANEL AND METHOD OF MANUFACTURING THE SAME

(75) Inventors: Ho-Jun Lee, Anyang-si (KR); Yeo-Geon Yoon, Seoul (KR); Hyoung-Wook Lee, Asan-si (KR); Mi-Ae Lee, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 278 days.

(21) Appl. No.: 12/875,228

(22) Filed: Sep. 3, 2010

(65) Prior Publication Data

US 2011/0095294 A1    Apr. 28, 2011

(30) Foreign Application Priority Data

Oct. 26, 2009  (KR) ................. 10-2009-0101840

(51) Int. Cl.
*H01L 33/00* (2010.01)
*H01L 21/84* (2006.01)

(52) U.S. Cl. ............ 257/59; 257/E27.11; 257/E23.001; 257/E21.704; 438/34; 349/38; 349/139; 349/144

(58) Field of Classification Search ............... 257/59, 257/E21.704, E27.111, E33.001; 438/34; 349/38, 139, 144

See application file for complete search history.

(56) References Cited

U.S. PATENT DOCUMENTS

2005/0078263 A1* 4/2005 Kim et al. ............... 349/144
2010/0259699 A1* 10/2010 Yen et al. ............... 349/38

* cited by examiner

*Primary Examiner* — Benjamin Sandvik
*Assistant Examiner* — Whitney T Moore
(74) *Attorney, Agent, or Firm* — Cantor Colburn LLP

(57) ABSTRACT

A thin film transistor array panel includes: an insulation substrate; a gate line disposed on the insulation substrate and including a compensation pattern protruding from the gate line; a first data line and a second data line both intersecting the gate line; a first thin film transistor connected to the gate line and the first data line; a second thin film transistor connected to the gate line and the second data line; and a first pixel electrode and a second pixel electrode connected to the first thin film transistor and the second thin film transistor, respectively. The first pixel electrode and the second pixel electrode share the compensation pattern.

14 Claims, 7 Drawing Sheets

THIN FILM TRANSISTOR ARRAY PANEL AND METHOD OF MANUFACTURING THE SAME

This application claims priority to Korean Patent Application No. 10-2009-0101840, filed on Oct. 26, 2009, and all the benefits accruing therefrom under 35 U.S.C. §119, the content of which in its entirety is herein incorporated by reference.

BACKGROUND OF THE INVENTION (1) Field of the Invention

The present invention relates to a thin film transistor array panel and a manufacturing method thereof.

(2) Description of the Related Art

A thin film transistor ("TFT") array panel is often used as a circuit board to drive pixels in a display device such as a liquid crystal display ("LCD") or an organic light emitting device ("OLED"), for example.

The thin film transistor array panel typically includes a gate line for transmitting a gate signal, a data line for transmitting a data signal, a thin film transistor connected to the gate line and the data line and a pixel electrode connected to the thin film transistor.

More particularly, the thin film transistor includes a gate electrode connected to the gate line, a semiconductor layer forming a channel, a source electrode connected to the data line and a drain electrode facing the source electrode with the semiconductor layer disposed therebetween. Thus, the thin film transistor is a switching element for controlling the data signal transmitted to the pixel electrode via the data line according to the gate signal supplied to the thin film transistor via the gate line.

Typically, the pixel electrode is connected to the drain electrode through a contact hole formed in a passivation layer, to thereby receive the data signal.

However, an aperture ratio of the pixel is decreased as a size of the contact hole is increased. Additionally, a slope of a side wall of the contact hole becomes steeper as the size of the contact hole is decreased and, as a result, a defect occurs, such as the pixel electrode becoming disconnected.

BRIEF SUMMARY OF THE INVENTION

Exemplary embodiments of the present invention provide a thin film transistor array panel having a substantially improved aperture ratio, and which effectively prevents disconnection of a pixel electrode at a contact hole of the thin film transistor array panel.

A thin film transistor array panel according to an exemplary embodiment of the present invention includes: an insulation substrate; a gate line disposed on the insulation substrate and including a compensation pattern protruding from the gate line; a first data line and a second data line intersecting the gate line; a first thin film transistor connected to the gate line and the first data line; a second thin film transistor connected to the gate line and the second data line; and a first pixel electrode and a second pixel electrode connected to the first thin film transistor and the second thin film transistor, respectively. The first pixel electrode and the second pixel electrode share the compensation pattern.

The first thin film transistor includes comprises a first drain electrode, the second thin film transistor includes a second drain electrode, and portions of the first drain electrode and the second drain electrode overlap portions of the compensation pattern.

The gate line is aligned along a first direction on the insulation substrate, the compensation pattern extends from the gate line along a second direction, substantially perpendicular to the first direction, and edges of the compensation pattern aligned along the second direction are substantially parallel to and face edges of a first gate electrode of the first thin film transistor and a second gate electrode of the second thin film transistor.

The thin film transistor array panel may further include a storage electrode line disposed along the first direction on the insulation substrate and storage electrodes extending from the storage electrode line along the second direction. The storage electrodes include a pair of first storage electrode disposed on opposite sides of the first data line or the second data line, and a second storage electrode disposed between the first pixel electrode and the second pixel electrode.

The storage electrode lines may further include a first protrusion and a second protrusion. A portion of the first protrusion and a portion of the second protrusion overlap a portion of the first drain electrode and a portion of the second drain electrode, respectively.

The first protrusion and the second protrusion may protrude from the storage electrode line along the second direction toward the first storage electrode and the second storage electrode, respectively. The compensation pattern is disposed between the first protrusion and the second protrusion.

The compensation pattern, the first thin film transistor, the second thin film transistor, the first protrusion and the second protrusion may be disposed in a space between the storage electrode line and the gate line.

A longitudinal peripheral portion of each of the first pixel electrode and the second pixel electrode may overlap a portion of the second storage electrode.

The first thin film transistor, the first pixel electrode and the first data line may be symmetric with the second thin film transistor, the second pixel electrode and the second data line about the second storage electrode.

The first pixel electrode and the second pixel electrode may include a third protrusion and a fourth protrusion, respectively, connected to the first drain electrode and the second drain electrode, respectively.

The thin film transistor array panel may further include a passivation layer disposed on the gate line, the first data line, the second data line, the first thin film transistor and the second thin film transistor.

The passivation layer may include contact holes exposing the first drain electrode and the second drain electrode, and at least one of side of at least one of the contact holes may have a slope of about 20 degrees (°) through about 40°.

The passivation layer may have negative photosensitivity.

The thin film transistor array panel may further include a plurality of the first thin film transistors and a plurality of the second thin film transistors, and the first thin film transistors of the plurality of first thin film transistors may be alternately disposed on right and left sides of the first data line, while the second thin film transistors of the plurality of second thin film transistors may be alternately disposed on right and left sides of the second data line.

A manufacturing method of a thin film transistor array panel according to another exemplary embodiment of the present invention includes: forming a gate line on an insulation substrate; forming a data line insulated from and intersecting the gate line; forming a thin film transistor connected to the gate line and the data line; forming a passivation layer having negative photosensitivity on the thin film transistor; exposing and developing the passivation layer using a photomask including a translucent portion, a transmittance portion and a blocking portion to form a contact hole; and forming a pixel electrode on the passivation layer and connected to the thin film transistor through the contact hole. A slope of a portion of the contact hole corresponding to the translucent portion is less than a slope of a portion of the contact hole corresponding to the transmittance portion at a side of the contact hole.

The translucent portion may include slits.

The slope of the side may decrease as a length of the slits increases.

The slope of the side may be from about 20° to about 40° with respect to a plane defined by the insulation substrate.

Thus, in one or more exemplary embodiments, a contact hole is formed such that a pixel electrode is connected to a drain electrode without a disconnection of the pixel without a reduction of an aperture ratio of the pixel.

BRIEF DESCRIPTION OF THE DRAWINGS

The above and other aspects of the present invention will become more readily apparent by describing in further detail exemplary embodiments thereof with reference to the accompanying drawings, in which.

DETAILED DESCRIPTION OF THE INVENTION

Figure 1:
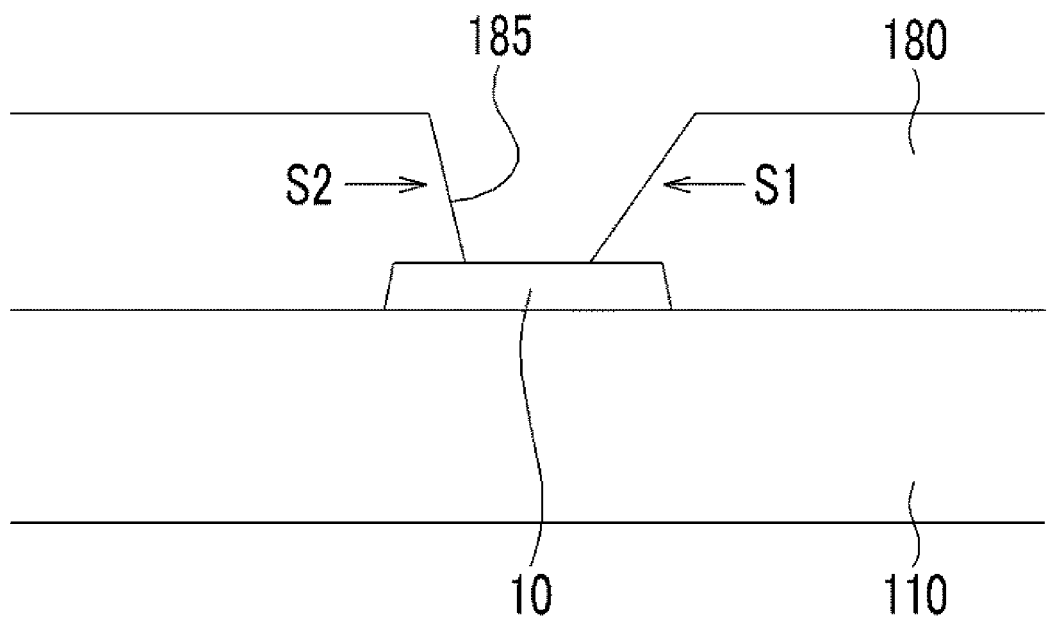
FIG. 1 is a cross-sectional view of an exemplary embodiment of a contact hole according to the present invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present invention will be described in further detail with reference to the accompanying drawings.

FIG. 1 is a cross-sectional view of an exemplary embodiment of a contact hole according to the present invention.

Referring to FIG. 1, a contact hole 185 of the present invention is formed in a passivation layer 180 disposed on an insulation substrate 110 including a conductor 10 disposed thereon. In an exemplary embodiment, when the contact hole 185 is formed to have a rectangular (or, more particularly, a square) plane pattern, and at least one side S1, e.g., a first side S1, of four sides of the contact hole 185 may have a smaller slope, e.g., a less steep slope) than another side S2, e.g., a second side S2. In an exemplary embodiment, the slope of the first side S1 may be in a range from about 20 degrees (°) to about 40° with respect to a plane defined by an upper surface of the insulation substrate 110 and/or the conductor 10.

When the slope of a side is decreased, an overlying thin film is formed thereon to have a smooth inclination surface, such that the thin film may be stably formed, thereby effectively preventing disconnection of the same. However, when the slope of the side is decreased, a length of the inclination surface is increased, and the plane area occupied by the contact hole 185 is increased. However, in one or more exemplary embodiments of the present invention, when the slope of at least one side is decreased, even though the slopes of the other sides are relatively steep, such that the thin film formed on the passivation layer 180 would otherwise be disconnected, the slope of the at least one side is less steep, accordingly, the thin film is connected to an underlying portion of the conductor 10 such that the risk of disconnection is substantially reduced and/or is effectively minimized.

An exemplary embodiment of a thin film transistor ("TFT") array panel including the contact hole described above and shown in FIG. 1 will now be described in further detail with reference to FIG. 2 and FIG. 3.

Figure 2:
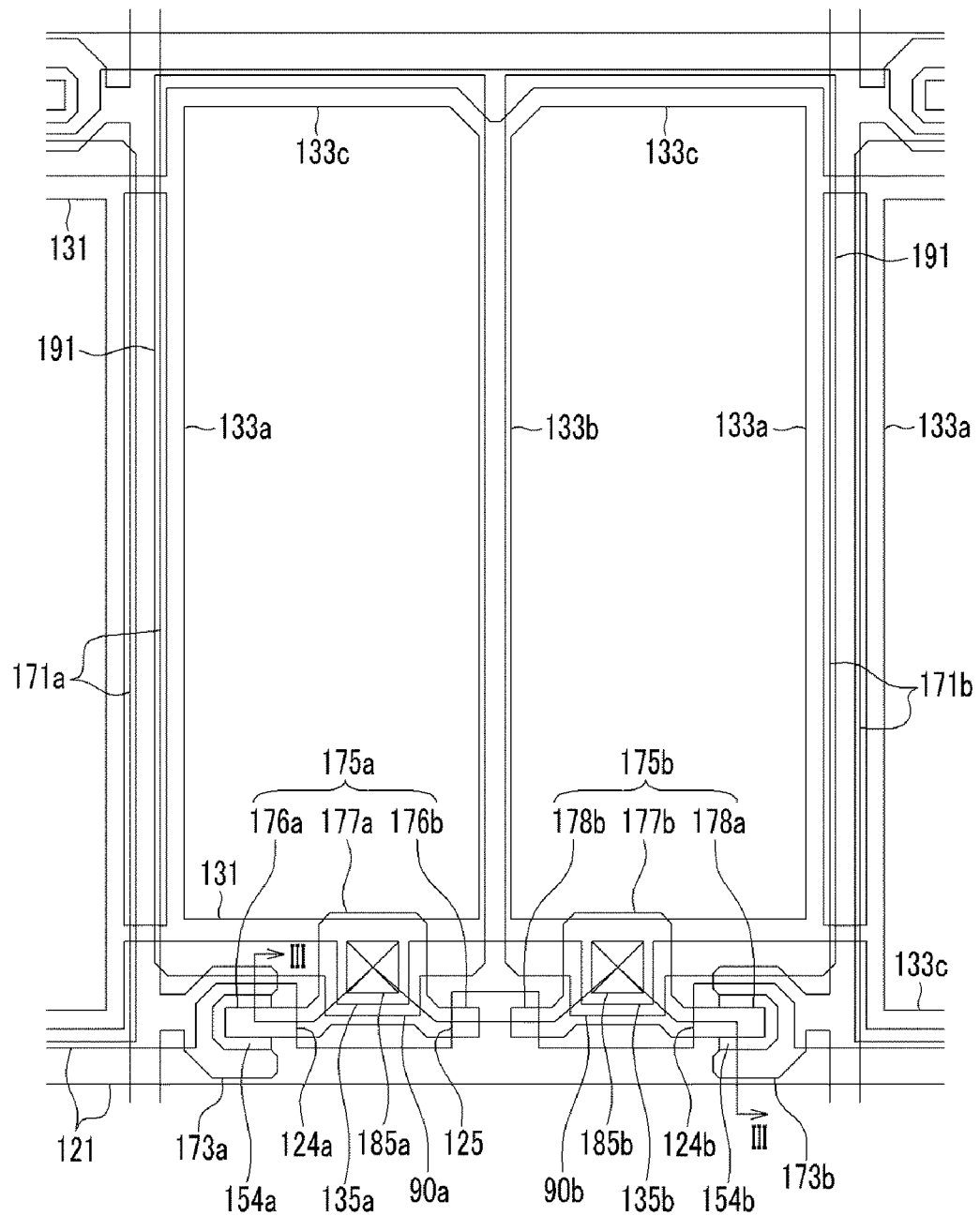
FIG. 2 is a plan view of an exemplary embodiment of a thin film transistor array panel according to the present invention.
Figure 3:
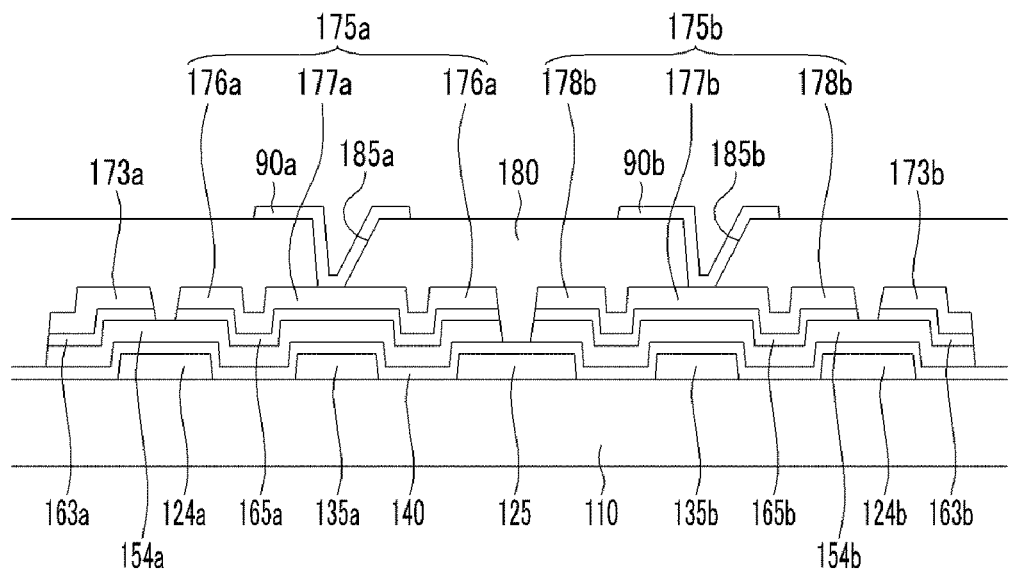
FIG. 3 is a cross-sectional view taken along line III-III of FIG. 2.

FIG. 2 is a plan view of an exemplary embodiment of a thin film transistor array panel according to the present invention, and FIG. 3 is a cross-sectional view taken along line III-III of FIG. 2.

Referring to FIGS. 2 and 3, a plurality of gate conductors, including a plurality of gate lines 121 and a plurality of storage electrode lines 131, is disposed on an insulation substrate 110 made of transparent glass or plastic, for example.

Gate lines 121 of the plurality of gate lines 121 transmit gate signals and along a first direction, which, as viewed in FIG. 2, is a substantially transverse direction. Each of gate lines 121 includes a plurality of first gate electrodes 124a and a plurality of second gate electrodes 124b protruding upward from the gate line 121 along a second direction, which is substantially perpendicular to the first direction (e.g., is a substantially longitudinal direction, as viewed in FIG. 2). In an exemplary embodiment, an end of each first gate electrode 124a of the plurality of first gate electrodes 124a and each second gate electrode 124b of the plurality of second gate electrodes 124b may be extended for connecting with another layer or external driving circuits (not shown).

The gate line 121 includes a compensation pattern 125 that protrudes along the same direction as the first gate electrodes 124a and the second gate electrodes 124b, e.g., along the second direction, as shown in FIG. 2.

Edges of the first gate electrode 124a, the second gate electrode 124b and the compensation pattern 125 are aligned substantially parallel to each other, and additionally are aligned substantially perpendicular to the gate line 121, e.g., are aligned along the second direction substantially perpendicular to the first direction.

The storage electrode lines 131 extend substantially in the first, transverse direction and receive a predetermined voltage. Each storage electrode line 131 includes storage electrodes 133a and 133b disposed above and below the storage electrode line 131, and the storage electrodes 133a and 133b are connected to each other by a transverse portion 133c. The storage electrode line 131 also includes protrusions 135a and 135b extending along the second direction from the storage electrode lines 133.

The storage electrode 133b positioned between two neighboring, e.g., adjacent, pixels may have a wider width than a width of the storage electrode 133a positioned on opposite sides of a given data line 171 (e.g., on opposite sides of a first data line 171a and/or opposite sides of a second data line 171b, as shown in FIG. 2).

A gate insulating layer 140, which in an exemplary embodiment is made of silicon nitride (SiNx) or silicon dioxide (SiOx), for example, is disposed on the gate lines 121 and the storage electrode lines 131, as shown in FIG. 3.

First semiconductor islands 154a and second semiconductor islands 154b, which are made of hydrogenated amorphous silicon ("a-Si") or crystallized silicon, for example, are disposed on the gate insulating layer 140. The first semiconductor islands 154a and the second semiconductor islands 154b overlap the first gate electrodes 124a and the second gate electrodes 124b, respectively, and include a semiconductor stripe (not shown) extending along the same direction as the storage electrode 133a.

Ohmic contacts 163a, 163b, 165a and 165b are disposed on the first semiconductor islands 154a and the second semiconductor islands 154b. In an exemplary embodiment, an ohmic contact (not shown) may be disposed on the semiconductor stripe. The ohmic contacts 163a, 163b, 165a and 165b may be made of n+ hydrogenated a-Si heavily doped with an N-type impurity such as phosphorous (P), or they may be made of a silicide, but alternative exemplary embodiments are not limited thereto. The ohmic contacts 163a, 163b, 165a and 165, which may be arranged in ohmic contacts pairs 163a and 165a, as well as 163b and 165b, are disposed in pairs on the first semiconductor islands 154a and the second semiconductor islands 154b, respectively.

A data conductor including a plurality of the first data lines 171a and the second data lines 171b, and a plurality of pairs of first drain electrodes 175a and second drain electrodes 175b are disposed on the gate insulating layer 140 and the ohmic contacts 163a, 163b, 163a and 165b.

The first data line 171a and the second data line 171b transmit data voltages and extend along the second, substantially longitudinal, direction, thereby intersecting the gate lines 121 and the storage electrode lines 131. Each of the first data lines 171a and the second data lines 171b includes a plurality of first source electrodes 173a and second source electrodes 173b, respectively, extending toward the first gate electrodes 124a and the second gate electrodes 124b, and an end of the first data line 171a and the second data line 171b may be extended for connecting with another layer or an external driving circuit (not shown).

The first drain electrode 175a and the second drain electrode 175b are separated from each other, and are separated from the first data line 171a and the second data line 171b. The first drain electrode 175a and the second drain electrode 175b face the first source electrode 173a and the second source electrode 173b, respectively.

The first drain electrode 175a and the second drain electrode 175b include expansions 177a and 177b, respectively, each having a wide area (relative to other areas of the first drain electrode 175a and the second drain electrode 175b) for connection with other layers, and branches 176a, 176b, 178a, and 178b extending to both sides. The expansions 177a and 177b are disposed between the first gate electrode 124a and the compensation pattern 125, and between the second gate electrode 124b and the compensation pattern 125, respectively. The branches 176a and 178a of one side extend toward the first gate electrodes 124a and the second gate electrodes 124b such that the ends thereof are respectively disposed on the first gate electrode 124a and the second gate electrode 124b and are enclosed by the first source electrode 173a and the second source electrode 173b. The branches 176b and 178b of the other side extend in the opposite direction to the first gate electrodes 124a and the second gate electrodes 124b toward the compensation pattern 125 such that the ends thereof overlap the compensation pattern 125.

Widths of the branches 176a, 176b, 178a and 178b of both sides are substantially the same, the branches 176a and 178a of one side meet substantially perpendicular to one edge of the first gate electrodes 124a and the second gate electrodes 124b, and the other branches 176b and 178b of the other side meet substantially perpendicular to one edge of the compensation pattern 125.

Thus, when forming the compensation pattern 125, even if relative positions between the gate conductor and the data conductor are changed along the first, transverse direction due to alignment deviations, for example, the overlapping areas between the first drain electrodes 175a and the second drain electrodes 175b and the gate line 121 are still uniform in an exemplary embodiment.

The first drain electrode 175, the first gate electrode 124a and the compensation pattern 125 will now be described in further with reference to FIG. 4 and FIG. 5.

Figure 4:
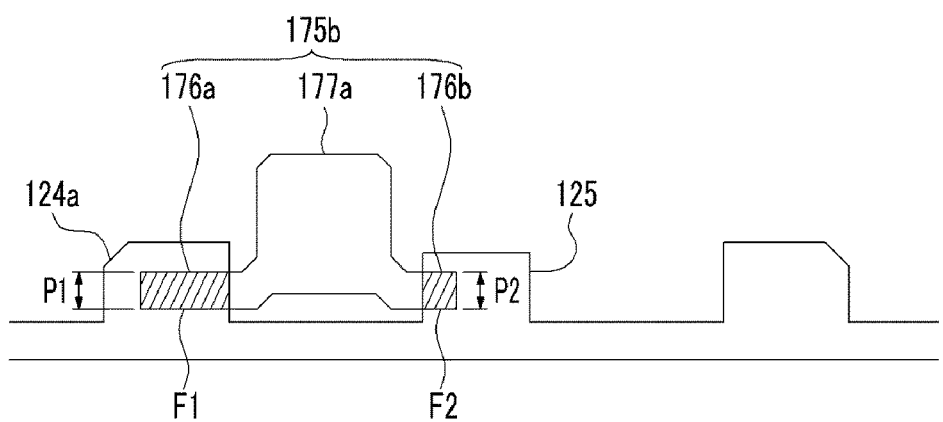
FIG. 4 is a plan view of a gate conductor and a data conductor aligned without an error in the thin film transistor array panel shown in FIG. 2.
Figure 5:
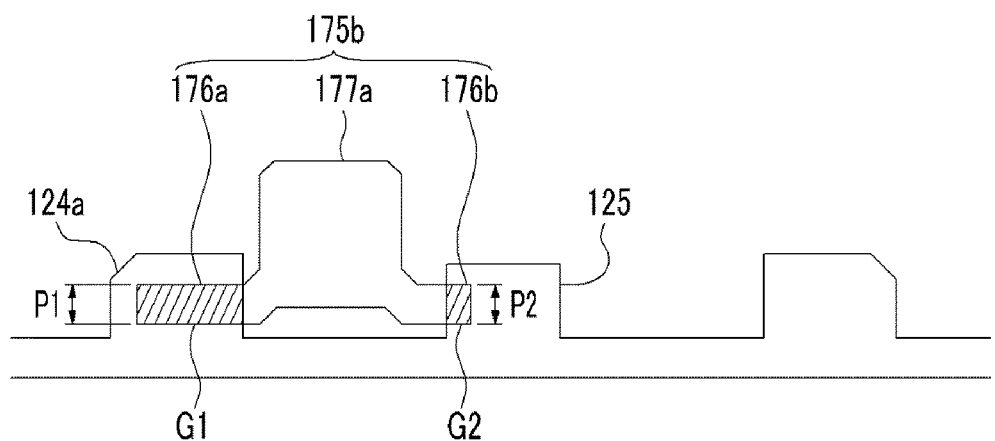
FIG. 5 is a plan view of a gate conductor and a data conductor that deviate from the correct position but within a permissible error range in the thin film transistor array panel shown in FIG. 2.

FIG. 4 is a plan view showing an exemplary embodiment in which a gate conductor and a data conductor are correctly aligned, e.g., without an error, in the thin film transistor array panel shown in FIG. 2, and FIG. 5 is a plan view showing another exemplary embodiment in which a gate conductor and a data conductor deviate from the correct position, in a permissible error range, in the thin film transistor array panel shown in FIG. 2.

Hatched regions in FIG. 4 and FIG. 5 indicate areas where the first gate electrode 124a and the compensation pattern 125 overlap the branches 176a and 176b of the first drain electrode 175a. For purposes of description herein, the branch disposed on the left side of the expansion 177a will be referred to as a left branch 176a and the branch disposed on the right side of the expansion 177a will be referred to as a right branch 176b.

As described in greater detail above, a longitudinal width P1 of the left branch 176a of the first drain electrode 175a is the same as a longitudinal width P2 of the right branch 176b in FIG. 4 and FIG. 5.

When aligning a mark for forming the data conductors at the correct position, the first gate electrode 124a and the left branch 176a of the first drain electrode 175a overlap by an overlapping portion F1, and the compensation pattern 125 and the right branch 176b overlap by an overlapping portion F2. A capacitance of a parasitic capacitor Cgd between first gate electrode 124a and the first drain electrode 175a is in proportion to the area of the overlapping portions F1 and F2.

As shown in FIG. 5, when the data conductor is formed after the mask is moved from the correct position to the left side, for example, the first gate electrode 124a and the left branch 176a of the first drain electrode 175a overlap by a deviated overlapping portion G1, and the compensation pattern 125 overlaps the right branch 176b of the first drain electrode 175a by a deviated overlapping portion G2.

Thus, as shown in FIG. 5, the data conductor is misaligned such that the area of G1 is greater than the area of F1, while the area of G2 is less than the area of F2, such that the effective cumulative overlap amount is substantially the same. Put another way, the area of G1+G2 is equal to the area of F1+F2, such that the capacitance of the parasitic capacitor Cgd is not changed. Similarly, the capacitance of the parasitic capacitor Cgd is the same if the misalignment is generated by movement in the rightward direction (as viewed in FIG. 5).

When the branches 176a and 176b of both sides of the first drain electrode 175a meet substantially perpendicularly to the compensation pattern 125 and are thereafter perpendicularly moved according to the boundary, a change of the overlapping area is not generated, such that a change of the capacitance of the parasitic capacitor is not generated or, alternatively, is insubstantial.

The relationship between the first drain electrode 175a, the first gate electrode 124a and the compensation pattern 125, as described above, is equally applicable to the second drain electrode 175b, the second gate electrode 124b and the compensation pattern 125.

In an exemplary embodiment of the present invention, the first drain electrode 175a and the second drain electrode 175b share one of the compensation patterns 125, such that the compensation pattern 125 may be formed with a minimized area.

Accordingly, the interval between the first gate electrodes 124a and the second gate electrodes 124b and the compensation pattern 125 is widened, such that the protrusions 135a and 135b of the storage electrode line 131 are disposed therebetween, thereby substantially increasing the aperture ratio of the pixel according to an exemplary embodiment.

The first gate electrode 124a, the first source electrode 173a and the first drain electrode 175a, along with the first semiconductor island 154a, form a first thin film transistor, while the second gate electrode 124b, the second source electrode 173b and the second drain electrode 175b, along with the second semiconductor island 154b, form a second thin film transistor. Channels of the first and second thin film transistors are respectively formed in the first semiconductor island 154a between the first source electrode 173a and the first drain electrode 175a, and the second semiconductor island 154b between the second source electrode 173b and the second drain electrode 175b.

The ohmic contacts 163a, 163b, 165a and 165b are interposed only between the first semiconductor islands 154a and the second semiconductor islands 154b, and the overlying data lines 171a and 171b and drain electrodes 175a and 175b, and substantially reduce a contact resistance between them. The first semiconductor islands 154a and the second semiconductor islands 154b each have a portion that is exposed, e.g., is not covered by the first data line 171a and the second data line 171b and the first drain electrodes 175a and the second drain electrodes 175b, and a portion between the first source electrodes 173a and the second source electrodes 173b and the first drain electrodes 175a and the second drain electrodes 175b.

A passivation layer 180 is disposed on the first data line 171a, the second data line 171b, the first drain electrode 175a, the second drain electrode 175b, the exposed first semiconductor island 154a and the exposed second semiconductor island 154b to protect the abovementioned components, including the first semiconductor islands 154a and the second semiconductor islands 154b. The passivation layer 180 may be formed of an organic material having a superior planarization characteristic and negative photosensitivity, for example, although additional exemplary embodiments are not limited thereto.

The passivation layer 180 includes a plurality of contact holes 185a and 185b for exposing the first drain electrode 175a and the second drain electrode 175b.

A slope of one or more sides of the contact holes 185a and 185b is from about 20° to about 40°, as described above with reference to FIG. 1. In an exemplary embodiment, the slope of the side closer to the pixel electrode 191 is greater than about 40°. This is because, if the slope of the side near the pixel electrode 191 is decreased such that the length of the inclination surface is increased, the side is disposed in the pixel electrode such that light leakage may be generated. Thus, in an exemplary embodiment of the present invention, slopes of the sides disposed at the positions through which line III-III (FIG. 3) passes are different from each other.

A plurality of the pixel electrodes 191 is disposed on the passivation layer 180. The pixel electrodes 191 may be made of a transparent conductive material, such as indium tin oxide ("ITO") or indium zinc oxide ("IZO'), for example.

In an exemplary embodiment, each pixel electrode 191 is approximately quadrangular in shape, and the corners thereof may be chamfered or, alternatively, may meet at substantially right angles (e.g., at 90° angles). In an exemplary embodiment, the chamfered edge forms an angle of about 45° with respect to the gate line 121.

The pixel electrode 191 includes protrusions 90a and 90b connected to the first drain electrode 175a and the second drain electrode 175b, respectively, through the contact holes 185a and 185b, respectively.

In an exemplary embodiment, one of the longitudinal sides of the pixel electrode 191, e.g., a longitudinal peripheral portion of the pixel electrode 191, is disposed proximate to or, alternatively, overlaps at least a portion of the first data line 171a and the second data line 171b, and the other, e.g., opposite, longitudinal peripheral portion overlaps at least a portion of the storage electrode 133b, as shown in FIG. 2. In an exemplary embodiment of the present invention, when the passivation layer 180 is made of an organic layer having a small dielectric constant, a parasitic capacitance between the pixel electrode 191 and the first data line 171a and second data line 171b is substantially reduced. Accordingly, the boundary of the pixel electrode 191 may be maximally positioned close to the first data line 171a and the second data line 171b such that the aperture ratio of the pixel is substantially increased.

In an exemplary embodiment of the present invention, the compensation pattern 125 of two neighboring, e.g., adjacent, pixels is shared, as shown in FIG. 2. As a result, the area between the first gate electrodes 124a and the second gate electrodes 124b and the compensation pattern 125 is increased. Accordingly, the protrusions 135a and 135b of the storage electrode line 131 do not overlap the pixel electrode 191 and are disposed toward the gate line 121 such that the aperture ratio of the pixel is increased.

Also, the protrusions 135a and 135b overlap the contact holes 185a and 185b such that a reduction of the aperture ratio of the pixel (due to the contact hole 185a) is effectively prevented. Accordingly, the size of the contact holes 185a and 185b need not reduced for a given and improved aperture ratio of the pixel. Put another way, as shown in FIG. 1, although the slope of the contact holes 185a and 185b are relatively long (as compared to contact holes having reduced sizes), the aperture ratio is not decreased. Accordingly, disconnection of the pixel electrode 191, due to a steep slope, is substantially reduced and/or is effectively prevented one or more exemplary embodiments described herein.

An exemplary embodiment of a manufacturing method of a thin film transistor array panel will now be described in further detail with reference to FIGS. 6 through 9.

FIGS. 6 through 9 are cross-sectional views, taken along line III-III of FIG. 2, illustrating an exemplary embodiment of a manufacturing method of a thin film transistor array panel according to the present invention. The same or like components in FIGS. 6-9 are labeled with the same reference characters as used in FIGS. 1-5, which were described in further detail above. Accordingly, any repetitive detailed description thereof will hereinafter be omitted or simplified.

Figure 6:
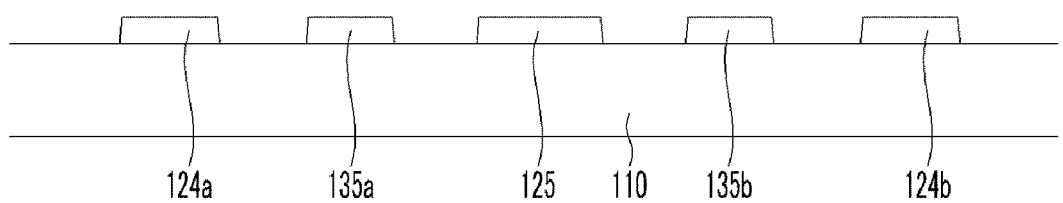
FIGS. 6 through 9 are cross-sectional views illustrating an exemplary embodiment of a manufacturing method of a thin film transistor array panel according to the present invention.

As shown in FIG. 6, a metal layer is deposited and patterned onto an insulation substrate 110 made of transparent glass or plastic, for example, to form a gate line 121 including first gate electrodes 124a, second gate electrodes 124b and a compensation pattern 125 extending from the gate line 121.

Figure 7:
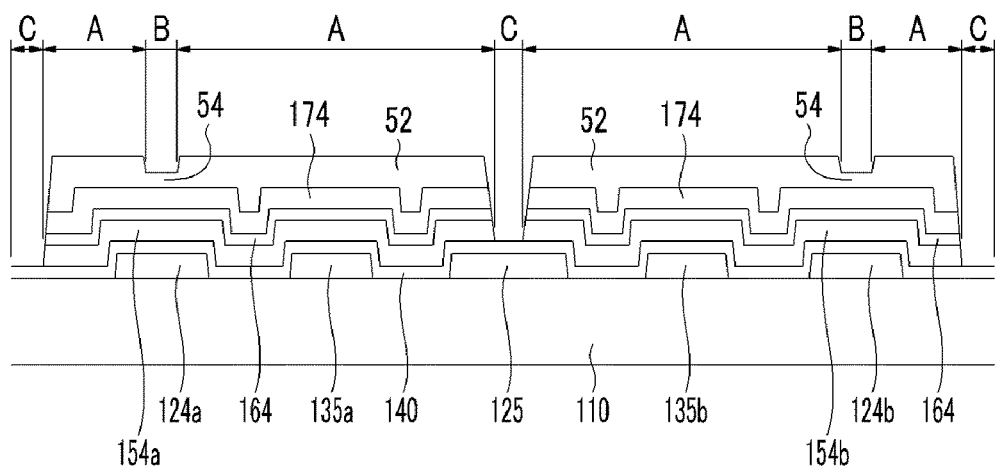

As shown in FIG. 7, a gate insulating layer 140 covering at least a portion of the first gate electrode 124a, the second gate electrode 124b and the compensation pattern 125 is formed.

An intrinsic amorphous silicon layer, an impurity amorphous silicon layer and a data metal layer are deposited onto the gate insulating layer 140.

A photosensitive film is coated onto the data metal layer, and is exposed and developed to form photosensitive film patterns 52 and 54, which have different thicknesses. In an exemplary embodiment, the portion of the data metal layer, the impurity amorphous silicon layer and the intrinsic amorphous silicon layer corresponding to the wiring is a wiring portion A, the portion corresponding to the channel on the first gate electrode 124a and the second gate electrode 124b is a channel portion B, and the portion exclusive of the wiring portion A and the channel portion B is a remaining portion C.

Among the photosensitive film patterns 52 and 54, the photosensitive film pattern 52, corresponding to the wiring portion A, is thicker than the photosensitive film pattern 54 corresponding to the channel portion B, and the photosensitive film (52 and 54) is removed from the remaining portion C. In an exemplary embodiment, the thickness ratio of the photosensitive film pattern 52 corresponding to the wiring portion A and the photosensitive film pattern 54 corresponding to the channel portion B may vary depending on etching process conditions, and in one or more exemplary embodiments, the thickness of the photosensitive film pattern 54 corresponding to the channel portion B is half (½) the thickness of the photosensitive film pattern 52 corresponding to the wiring portion A, but alternative exemplary embodiments are not limited thereto.

Various methods for forming the photosensitive pattern such that portions thereof have different thicknesses according to their positions may be used, such as by using an exposure mask that includes a transparent area, a light blocking area and a semi-transparent area, for example. In an exemplary embodiment, the semi-transparent area includes a slit pattern, a lattice pattern or a thin film having medium transmittance or having a medium thickness. When the slit pattern is used, widths of the slits (or the spaces between the slits) are smaller than the resolution of a light exposer used for photolithography. Another exemplary embodiment of the method includes using a reflowable photosensitive film. Specifically, the method according to one exemplary embodiment forms a thin portion by making a photosensitive film flow into a region where the photosensitive film is not present after forming the reflowable photosensitive film with a general exposure mask having only a light transmitting area and a light blocking area.

The exposed lower layers are etched by using the photosensitive film patterns 52 and 54 as an etching mask to form a data metal pattern 174, an ohmic contact layer pattern 164, the first semiconductor island 154a and the second semiconductor island 154b.

Figure 8:
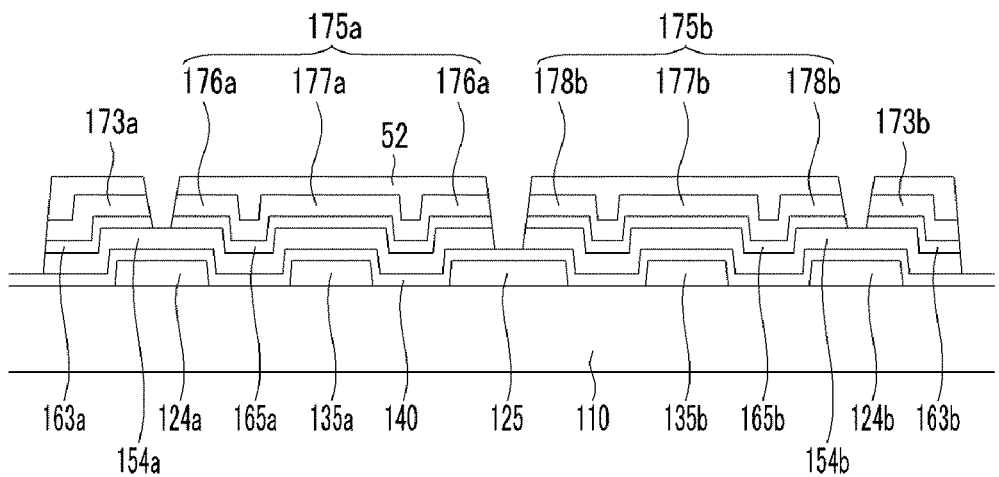

As shown in FIG. 8, an etch-back process is performed for the photosensitive film to remove the photosensitive film corresponding to the channel portion B. In an exemplary embodiment, the thickness of the photosensitive film pattern 52 corresponding to the wiring portion A is reduced. The exposed data metal pattern and the ohmic contact pattern are etched by using a remaining portion of the photosensitive film pattern 52 as a mask to form the first data line 171a and the second data line 171b having the first source electrode 173a and the second source electrode 173b, respectively, and the first drain electrode 175a and the second drain electrode 175b, as well as ohmic contacts 163a, 163b, 165a and 165b.

The first data line 171a and the second data line 171b, as well as the first drain electrode 175a and the second drain electrode 175b, have substantially the same plane pattern as the ohmic contacts 163a, 163b, 165a and 165b, and have substantially the same plane pattern as the first semiconductor islands 154a and the second semiconductor islands 154b, except for the exposed portion between both the first drain electrode 175a and the second drain electrode 175b, as well as between the first source electrode 173a and the second source electrode 173b.

In an exemplary embodiment, the semiconductor, the ohmic contact, the data line, and the drain electrode may be respectively formed by using different etching masks, and in this case, the semiconductor and the ohmic contact may be etched by using one mask, the data line and the drain electrode may be etched by using one mask and the ohmic contact may be etched by using the data line and the drain electrode as the mask.

Accordingly, in an additional exemplary embodiment, the data line and drain electrode may not have the same plane pattern as the ohmic contact, and the semiconductor may only be formed at the region overlapping the gate electrode.

Figure 9:
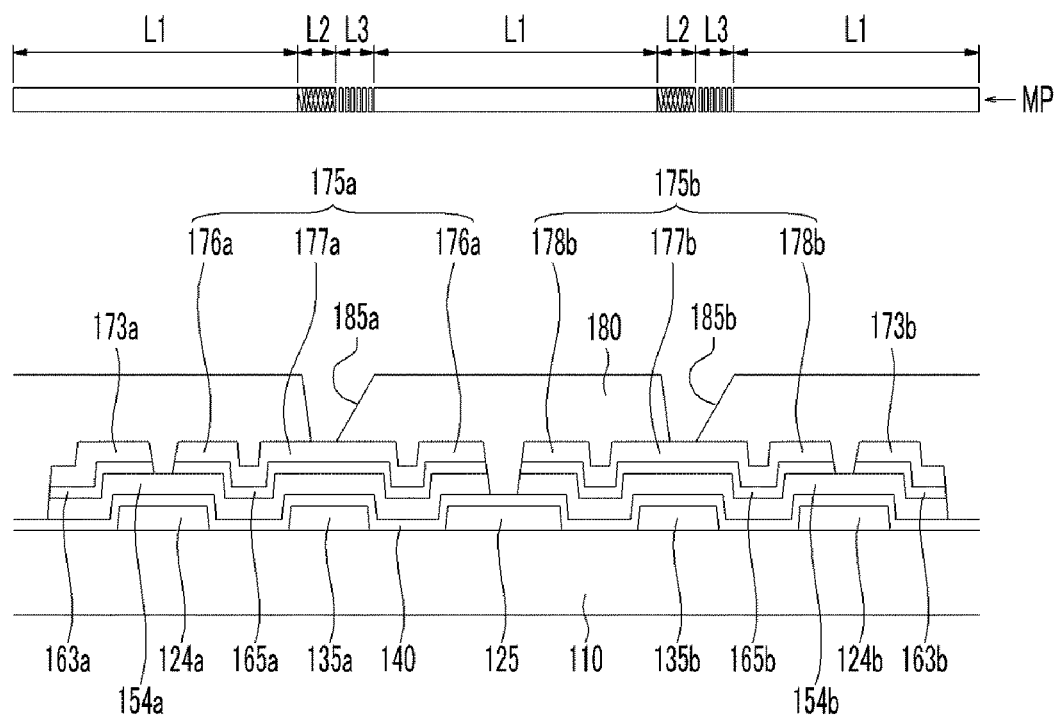

As shown in FIG. 9, a passivation layer 180, which in an exemplary embodiment is made of an organic material, is formed to cover the exposed portions of the first semiconductor islands 154a and the second semiconductor islands 154b. Additionally, portions of the passivation layer 180 are exposed and developed by using a photomask, including a slit pattern, to form the first contact hole 185a and the second contact hole 185b for exposing the first drain electrode 175a and the second drain electrode 175b, respectively.

In an exemplary embodiment, the passivation layer 180 has negative photosensitivity, such that a portion thereof that is irradiated remains. When the passivation layer 180 has negative photosensitivity, the slope of the side forming the contact hole is steep compared to when the passivation layer 180 has positive photosensitivity.

As shown in FIG. 9, a photomask MP including a transmittance portion L1, a blocking portion L2 and a translucent portion L3 are used to form a side having a relatively low slope (as compared to the other sides). More specifically, in an exemplary embodiment, the translucent portion L3 includes a plurality of slits, and a length of the slits is controlled to control the slope of the side. More particularly, the slope of the inclination surface is decreased and the length of the inclination surface is increased as the length of the slits is increased. The translucent portion L3 transmits a portion of the light such that a portion of the organic material is removed, thereby decreasing the slope of the corresponding side.

A pixel electrode 191 (FIG. 3) is connected to the first drain electrode 175a and the second drain electrode 175b through the first contact hole 185a and the second contact hole 185b.

Figure 10:
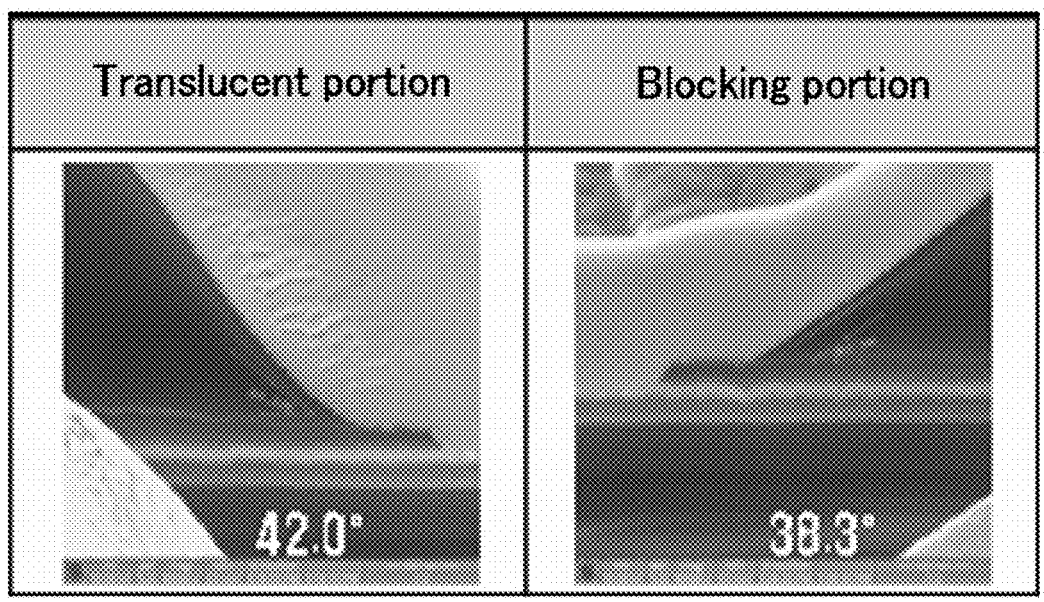
FIG. 10 is a photograph showing a side of an exemplary embodiment of a contact hole according to the present invention.

FIG. 10 is a photograph showing a side of a contact hole according to an exemplary embodiment of the present invention.

Referring to FIG. 10, the inclination angle of the portion corresponding to the translucent portion is about 38.8°, however the inclination angle of the portion corresponding to the blocking portion without the translucent portion is about 42.0°, and accordingly it is confirmed that the inclination angle is decreased due to the translucent portion.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A thin film transistor array panel comprising:
   an insulation substrate;
   a gate line, disposed on the insulation substrate, and including a compensation pattern protruding therefrom;
   a first data line intersecting the gate line;
   a second data line intersecting the gate line;
   a first thin film transistor connected to the gate line and the first data line;
   a second thin film transistor connected to the gate line and the second data line;
   a first pixel electrode connected to the first thin film transistor; and
   a second pixel electrode connected to the second thin film transistor,
   wherein the first pixel electrode and the second pixel electrode share the compensation pattern.

2. The thin film transistor array panel of claim 1, wherein the first thin film transistor comprises a first drain electrode,
   the second thin film transistor comprises a second drain electrode, and
   portions of the first drain electrode and the second drain electrode overlap portions of the compensation pattern.

3. The thin film transistor array panel of claim 2, wherein the gate line is aligned along a first direction on the insulation substrate,
   the compensation pattern extends from the gate line along a second direction, substantially perpendicular to the first direction, and
   edges of the compensation pattern aligned along the second direction are substantially parallel to and face edges of a first gate electrode of the first thin film transistor and a second gate electrode of the second thin film transistor.

4. The thin film transistor array panel of claim 3, further comprising:
   a storage electrode line disposed along the first direction on the insulation substrate; and
   a plurality of storage electrodes extending from the storage electrode line along the second direction,
   wherein the plurality of storage electrodes comprises:
      a pair of first storage electrodes disposed on opposite sides of one of the first data line and the second data line; and
      a second storage electrode disposed between the first pixel electrode and the second pixel electrode.

5. The thin film transistor array panel of claim 4, wherein the plurality of storage electrode lines further comprises a first protrusion and a second protrusion, and
   a portion of the first protrusion and a portion of the second protrusion overlap a portion of the first drain electrode and a portion of the second drain electrode, respectively.

6. The thin film transistor array panel of claim 5, wherein the first protrusion and the second protrusion protrude from the storage electrode line along the second direction toward the first storage electrode and the second storage electrode, respectively, and
the compensation pattern is disposed between the first protrusion and the second protrusion.

7. The thin film transistor array panel of claim 6, wherein the compensation pattern, the first thin film transistor, the second thin film transistor, the first protrusion and the second protrusion are disposed in a space between the storage electrode line and the gate line.

8. The thin film transistor array panel of claim 5, wherein the first pixel electrode and the second pixel electrode include a third protrusion and a fourth protrusion, respectively, connected to the first drain electrode and the second drain electrode, respectively.

9. The thin film transistor array panel of claim 4, wherein a longitudinal peripheral portion of each of the first pixel electrode and the second pixel electrode overlap a portion of the second storage electrode.

10. The thin film transistor array panel of claim 4, wherein the first thin film transistor, the first pixel electrode and the first data line are symmetric with the second thin film transistor, the second pixel electrode and the second data line about the second storage electrode.

11. The thin film transistor array panel of claim 2, further comprising
a passivation layer disposed on the gate line, the first data line, the second data line, the first thin film transistor and the second thin film transistor.

12. The thin film transistor array panel of claim 11, wherein the passivation layer includes contact holes exposing the first drain electrode and the second drain electrode, and at least one of side of at least one of the contact holes has a slope of about 20 degrees through about 40 degrees with respect to a plane defined by the insulation substrate.

13. The thin film transistor array panel of claim 11, wherein the passivation layer has negative photosensitivity.

14. The thin film transistor array panel of claim 1, further comprising a plurality of the first thin film transistors and a plurality of the second thin film transistors, wherein
the first thin film transistors of the plurality of first thin film transistors are alternately disposed on right and left sides of the first data line, and
the second thin film transistors of the plurality of second thin film transistors are alternately disposed on right and left sides of the second data line.

forming a gate line on an insulation substrate;
forming a data line insulated from and intersecting the gate line;
forming a thin film transistor connected to the gate line and the data line;
forming a passivation layer having negative photosensitivity on the thin film transistor;
exposing and developing the passivation layer using a photomask including a translucent portion, a transmittance portion and a blocking portion to form a contact hole; and
forming a pixel electrode on the passivation layer and connected to the thin film transistor through the contact hole,
wherein a slope of a portion of the contact hole corresponding to the translucent portion is less than a slope of a portion of the contact hole corresponding to the transmittance portion at a side of the contact hole.

* * * * *